(12) United States Patent
Kim et al.

(10) Patent No.: US 9,455,013 B2
(45) Date of Patent: Sep. 27, 2016

(54) SYSTEM AND METHOD TO TRIM REFERENCE LEVELS IN A RESISTIVE MEMORY

(71) Applicant: QUALCOMM Incorporated, San Diego, CA (US)

(72) Inventors: Taehyun Kim, Cupertino, CA (US); Jung Pill Kim, San Diego, CA (US); Sungryul Kim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/992,753

(22) Filed: Jan. 11, 2016

(65) Prior Publication Data

US 2016/0125926 A1  May 5, 2016

Related U.S. Application Data

(63) Continuation of application No. 14/040,332, filed on Sep. 27, 2013, now Pat. No. 9,251,881.

(51) Int. Cl.
*G11C 11/00* (2006.01)
*G11C 11/16* (2006.01)
(Continued)

(52) U.S. Cl.
CPC ............. *G11C 11/1673* (2013.01); *G11C 7/14* (2013.01); *G11C 11/15* (2013.01); *G11C 11/16* (2013.01);
(Continued)

(58) Field of Classification Search
CPC ............. G11C 13/0069; G11C 13/004; G11C 13/0004; G11C 16/26; G11C 11/161; G11C 11/1673; G11C 11/1675; G11C 16/3459; G11C 11/5628; G11C 11/5642; G11C 16/08; G11C 16/10; G11C 16/14; G11C 8/08; G11C 11/406; G11C 16/0483
USPC .................. 365/148, 158, 185.03, 222, 163, 365/185.11, 185.22, 185.12, 185.18, 365/185.21, 185.29, 189.011, 189.05, 154, 365/185.19, 185.25, 189.15
See application file for complete search history.

(56) References Cited

U.S. PATENT DOCUMENTS 6,707,710 B1   3/2004  Holden
7,453,719 B2   11/2008  Sakimura et al.
(Continued)

FOREIGN PATENT DOCUMENTS

WO   2011119938 A1   9/2011
WO   2013103516 A1   7/2013

OTHER PUBLICATIONS

Communication Relating to the Results of the Partial International Search for International Application No. PCT/US2014/056019, ISA/EPO, Date of Mailing Dec. 16, 2014, 6 pages.
(Continued)

*Primary Examiner* — Thong Q Le
(74) *Attorney, Agent, or Firm* — Toler Law Group, PC

(57) ABSTRACT

A method includes, at a resistive memory device, determining an average effective reference resistance level based on a first effective reference resistance and a second effective reference resistance. The first effective reference resistance is based on a first set of reference cells of the resistive memory device and the second effective reference resistance is based on a second set of reference cells of the resistive memory device. The method includes trimming a reference resistance at least partially based on the average effective reference resistance level. Trimming the reference resistance includes, in response to determining that the first effective reference resistance is not substantially equal to the average effective reference resistance level, modifying one or more states of one or more magnetic tunnel junction devices associated with the first effective reference resistance.

30 Claims, 8 Drawing Sheets

(51) Int. Cl.
   *G11C 13/00*   (2006.01)
   *G11C 7/14*    (2006.01)
   *G11C 11/15*   (2006.01)
   *G11C 29/02*   (2006.01)
(52) U.S. Cl.
   CPC ....... *G11C 11/1675* (2013.01); *G11C 13/0002* (2013.01); *G11C 13/004* (2013.01); *G11C 29/021* (2013.01); *G11C 29/028* (2013.01); *G11C 2013/0042* (2013.01); *G11C 2013/0054* (2013.01)

(56)     References Cited

U.S. PATENT DOCUMENTS

| 2006/0028889 | A1 | 2/2006 | Liaw |
| 2006/0290387 | A1 | 12/2006 | Gossmann et al. |
| 2009/0201717 | A1 | 8/2009 | Maeda et al. |
| 2009/0237977 | A1* | 9/2009 | Ramani ............... G11C 11/5678 365/148 |
| 2012/0314478 | A1 | 12/2012 | Ha et al. |
| 2013/0051123 | A1 | 2/2013 | Lee et al. |
| 2014/0029030 | A1 | 1/2014 | Miller |
| 2014/0269030 | A1 | 9/2014 | Chih et al. |
| 2015/0092469 | A1 | 4/2015 | Kim et al. |

OTHER PUBLICATIONS

International Search Report and Written Opinion for International Application No. PCT/US2014/056019, ISA/EPO, Date of Mailing Apr. 9, 2015, 17 pages.

* cited by examiner

SYSTEM AND METHOD TO TRIM REFERENCE LEVELS IN A RESISTIVE MEMORY

I. CROSS REFERENCE TO RELATED APPLICATIONS

This application claims priority from and is a continuation application of U.S. patent application Ser. No. 14/040,332, filed on Sep. 27, 2013 and entitled "SYSTEM AND METHOD TO TRIM REFERENCE LEVELS IN A RESISTIVE MEMORY," the content of which is incorporated by reference herein in its entirety.

II. FIELD

The present disclosure is generally related to a system and method to trim reference levels in a resistive memory.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Computing devices such as wireless telephones described above, may include resistive memory devices. Resistive memory devices may use one or more resistive memory data cells and one or more resistive memory reference cells to determine a bit value. A magnetoresistive random access memory (MRAM) device is an example of a resistive memory device. An MRAM data cell may include a magnetic tunnel junction (MTJ) device, and an MRAM reference cell may include a pair of MTJ devices. A direction of a magnetic moment of a free layer of the MTJ device of the data cell may be changed in relation to a pinned layer of the MTJ device (e.g., from a parallel state to an anti-parallel state). The MTJ device may have a higher resistance in the anti-parallel state as compared to in the parallel state. A logic value of the memory cell may be set to a logical "0" value (e.g., parallel state) or to a logical "1" value (e.g., antiparallel state) by setting the state of the MTJ device.

By comparing a data voltage based on the data cell to a reference voltage based on an effective reference resistance associated with multiple reference cells, the logic value of the data cell may be determined. For example, a data voltage may be generated by a sensing current flowing through the MTJ device of the data cell. The reference voltage may be generated using a set of reference cells, each reference cell including a pair of MTJ devices, with one MTJ device in a parallel state and the other MTJ device in an antiparallel state. By comparing the data voltage to the reference voltage, a sense amplifier may determine the logic value of the data cell. However, reference resistance values of reference cells may vary with respect to other reference cells, such as due to process variations. The variation of reference resistance values between MTJ devices reduces read sensing margins and reduces die yield.

IV. SUMMARY

A system and method is disclosed that provides reduced reference resistance level variation across a resistive memory device by trimming reference resistance levels to a target level without incurring additional costs associated with use of external testing circuitry. The target level may be based on multiple effective reference resistances. Each effective reference resistance is a resistance level based on a set of reference cells. The set of reference cells may correspond to a particular word line of the resistive memory device. For example, the target level may be based on an average reference resistance corresponding to multiple effective reference resistance levels associated with multiple word lines of the resistive memory device. The resistive memory device may include circuitry to determine the target level by measuring the effective reference resistance levels associated with the multiple word lines and averaging the measured effective reference resistance levels. The resistive memory device may also include circuitry to trim a reference resistance level of a particular effective reference resistance associated with a word line to the target level. The trimming may be performed automatically by the resistive memory device and does not require external tester interaction.

In a particular embodiment, a method, at a resistive memory device, includes measuring a first effective reference resistance. The first effective reference resistance is based on a first set of reference cells of the resistive memory device. The method further includes measuring a second effective reference resistance. The second effective reference resistance is based on a second set of reference cells of the resistive memory device. The method also includes determining a target reference resistance level based on the first effective reference resistance and the second effective reference resistance. The method includes trimming a reference resistance based on the target reference resistance level.

In another particular embodiment, a semiconductor device includes a resistive memory that includes multiple sets of reference cells. The resistive memory also includes a reference resistance measurement circuit. A first set of reference cells is accessible by the reference resistance measurement circuit to measure a first effective reference resistance corresponding to the first set of reference cells. A second set of reference cells is accessible by the reference resistance measurement circuit to measure a second effective reference resistance corresponding to the second set of reference cells. The resistive memory also includes a trimming circuit configured to set a reference resistance of the resistive memory reference array based on the measured first effective resistance and the measured second effective resistance.

In another particular embodiment, an apparatus includes means for storing multiple reference resistance values. The multiple reference resistance values are arranged in multiple sets of reference cells. The apparatus further includes means for accessing a first set of reference cells to measure a first effective reference resistance corresponding to the first set of reference cells and accessing a second set of reference cells to measure a second effective reference resistance corresponding to the second set of reference cells. The apparatus also includes means for setting a reference resistance based on the first effective reference resistance and the second effective reference resistance.

In another particular embodiment, a method includes a first step for initiating, at a resistive memory device, measuring of a first effective reference resistance. The first effective reference resistance is based on a first set of reference cells of the resistive memory device. The method further includes a second step for initiating, at the resistive memory device, measuring of a second effective reference resistance. The second effective reference resistance is based on a second set of reference cells of the resistive memory device. The method also includes a third step for initiating, at the resistive memory device, determining of a target reference resistance level based on the first effective reference resistance and the second effective reference resistance. The method includes a fourth step for initiating, at the resistive memory device, trimming of a reference resistance at least partially based on the target reference resistance level.

In another particular embodiment, a computer readable storage device stores instructions that, when executed by a processor, cause the processor to perform operations including, at a resistive memory device, measuring a first effective reference resistance. The first effective reference resistance is based on a first set of reference cells of the resistive memory device. The operations further include measuring a second effective reference resistance. The second effective reference resistance is based on a second set of reference cells of the resistive memory device. The operations also include determining a target reference resistance level based on the first effective reference resistance and the second effective reference resistance. The operations include trimming a reference resistance based on the target reference resistance level.

In another particular embodiment, a method includes receiving design information representing at least one physical property of a semiconductor device, the semiconductor device including a resistive memory that includes multiple sets of reference cells. The resistive memory also includes a reference resistance measurement circuit. A first set of reference cells is accessible by the reference resistance measurement circuit to measure a first effective reference resistance corresponding to the first set of reference cells. A second set of reference cells is accessible by the reference resistance measurement circuit to measure a second effective reference resistance corresponding to the second set of reference cells. The resistive memory also includes a trimming circuit configured to set a reference resistance of the resistive memory reference array based on the measured first effective resistance and the measured second effective resistance. The method further includes transforming the design information to comply with a file format. The method also includes generating a data file including the transformed design information.

In another particular embodiment, a method includes receiving a data file including design information corresponding to a semiconductor device. The method further includes fabricating the semiconductor device according to the design information, where the semiconductor device comprises a resistive memory that includes multiple sets of reference cells. The resistive memory also includes a reference resistance measurement circuit. A first set of reference cells is accessible by the reference resistance measurement circuit to measure a first effective reference resistance corresponding to the first set of reference cells. A second set of reference cells is accessible by the reference resistance measurement circuit to measure a second effective reference resistance corresponding to the second set of reference cells. The resistive memory also includes a trimming circuit configured to set a reference resistance of the resistive memory reference array based on the measured first effective resistance and the measured second effective resistance.

In another particular embodiment, a method includes receiving design information including physical positioning information of a packaged semiconductor device on a circuit board. The packaged semiconductor device includes a resistive memory that includes multiple sets of reference cells. The resistive memory also includes a reference resistance measurement circuit. A first set of reference cells is accessible by the reference resistance measurement circuit to measure a first effective reference resistance corresponding to the set of reference cells. A second set of reference cells is accessible by the reference resistance measurement circuit to measure a second effective reference resistance corresponding to the second set of reference cells. The resistive memory also includes a trimming circuit configured to set a reference resistance of the resistive memory reference array based on the measured first effective resistance and the measured second effective resistance. The method further includes transforming the design information to generate a data file.

In another particular embodiment, a method includes receiving a data file including design information including physical positioning information of a packaged semiconductor device on a circuit board. The method further includes manufacturing the circuit board configured to receive the packaged semiconductor device according to the design information. Where the packaged semiconductor device includes a resistive memory that includes multiple sets of reference cells. The resistive memory also includes a reference resistance measurement circuit. A first set of reference cells is accessible by the reference resistance measurement circuit to measure a first effective reference resistance corresponding to the first set of reference cells. A second set of reference cells is accessible by the reference resistance measurement circuit to measure a second effective reference resistance corresponding to the second set of reference cells. The resistive memory also includes a trimming circuit configured to set a reference resistance of the resistive memory reference array based on the measured first effective resistance and the measured second effective resistance.

One particular advantage provided by at least one of the disclosed embodiments is the ability to trim a reference resistance based on a target reference resistance. The trimming is enabled by the reference resistance measurement circuit and the trimming circuit. Because the trimming is enabled by circuitry within the semiconductor device, additional external testing equipment is not required.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
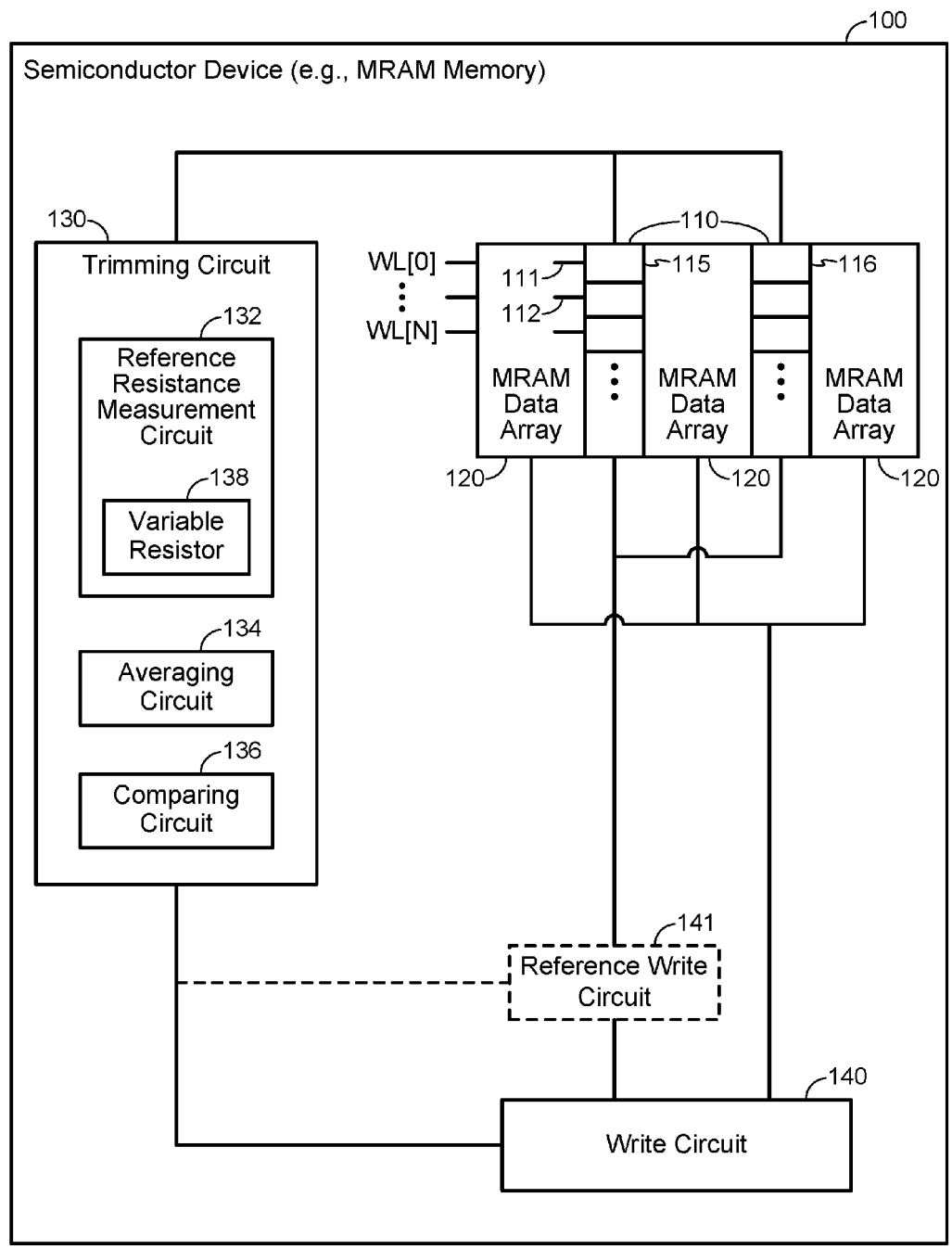
FIG. 1 is a block diagram of a first particular illustrative embodiment of a semiconductor device with a trimming circuit.

Referring to FIG. 1, a particular illustrative embodiment of a semiconductor device 100 includes a resistive memory reference array 110. The semiconductor device 100 also includes a resistive memory data array 120 coupled to the resistive memory reference array 110. The semiconductor device 100 also includes a trimming circuit 130 coupled to the resistive memory reference array 110. The semiconductor device 100 also includes a write circuit 140 coupled to the trimming circuit 130 and coupled to the resistive memory reference array 110. The write circuit 140 is also coupled to the resistive memory data array 120. The trimming circuit 130 enables the resistive memory device 100 to trim effective reference resistances associated with the resistive memory reference array 110 to reduce a reference resistance variation at the resistive memory device 100. The resistive memory device 100 may be any type of resistive memory device (e.g., any random access memory where a data cell that is set to a logical "0" value exhibits a different resistance value than when the data cell is set to a logical "1" value) including a magnetoresistive random access memory (MRAM) device, a resistive random access memory (ReRAM) device, a phase change random access memory (PCRAM) device, or any combination thereof.

The resistive memory reference array 110 includes a plurality of sets of reference cells. For example, the sets of reference cells may be arranged as word lines WL[0] . . . WL[N], including a first illustrated word line 111 and a second illustrated word line 112. Each of the word lines WL[0] . . . WL[N] may correspond to a row of the resistive memory reference array 110 and of the resistive memory data array 120 and may be associated with multiple reference cells. The first word line 111 is illustrated as being associated with a first reference cell 115 and a second reference cell 116. Although FIG. 1 shows two resistive memory reference arrays with each word line coupled to two reference cells, each word line may include any number of reference cells. Also, the resistive memory reference array 110 may include any number of word lines.

Each of the word lines WL[0] . . . WL[N] may have a corresponding effective reference resistance. Each effective reference resistance may include a resistance based on a combination of resistances corresponding to multiple reference cells associated with a word line. For example, a reference resistance may be based on a resistance exhibited by a parallel combination of multiple reference cells associated with a word line multiplied by the number of reference cells. In an exemplary embodiment, the first word line 111 includes two reference cells 115, 116. An effective reference resistance of the first word line 111 may be based on a resistance exhibited by a parallel combination of reference resistances associated with multiple reference cells of the first word line 111. A resistance level of the parallel combination may be multiplied by the number of reference cells. Thus, the effective reference resistance may be an average reference resistance corresponding to a word line. For example, the effective reference resistance corresponding to the first word line 111 may be based on a resistance exhibited by a parallel combination of a reference resistance associated with the reference cell 115 and a reference resistance associated with the reference cell 116. A resistance level of the parallel combination may be multiplied by two (2) because two reference cells are used. Although the effective reference resistance of the first word line 111 in the example of FIG. 1 is based on two reference cells, in practice each word line WL[0] . . . WL[N] may include any number of reference cells to reduce the effect of any one reference cell on the effective reference resistance of the word line 111.

The trimming circuit 130 may include a reference resistance measurement circuit 132. The reference resistance measurement circuit 132 may be configured to measure the effective reference resistance exhibited by the first reference cell 115 and the second reference cell 116. The reference resistance measurement circuit 132 may also be configured to measure reference cells associated with the second word line 112. Thus, the reference measurement circuit may be configured to measure the first effective reference resistance corresponding to the first word line 111 and configured to measure the second effective reference resistance corresponding to the second word line 112. Similarly, the reference resistance measurement circuit 132 may be configured to measure additional effective reference resistances corresponding to additional word lines of the resistive memory device 100. The reference resistance measurement circuit may include a variable resistor 138 usable for measuring the effective reference resistances. For example, the variable resistor 138 may be incrementally set by the reference resistance measurement circuit 138 to be substantially equal (e.g., within a step resistance value) to a measured effective resistance.

The trimming circuit 130 may also include an averaging circuit 134. Effective reference resistance values determined by the reference resistance measurement circuit 132 may be accessed by the averaging circuit 134 to determine an average effective reference resistance. For example, the reference resistance measurement circuit 132 may store multiple measured effective reference resistance levels. The multiple stored measured effective reference resistance levels may be used by the averaging circuit 134 to determine the average effective reference resistance. For example, the averaging circuit 134 may generate a value corresponding to an arithmetic mean of effective reference resistance corresponding to one or more of the word lines that are measured by the reference resistance measurement circuit 132. In a particular embodiment, the averaging circuit 134 generates an average effective reference resistance for all word lines in the resistive memory reference array 110. The trimming circuit 130 may also include a comparing circuit 136 to enable the trimming circuit 130 to compare the effective reference resistance values of each word line to the average effective reference resistance.

The semiconductor device 100 may also include a write circuit 140 that is responsive to the trimming circuit 130 to selectively write parallel and/or antiparallel states to magnetic tunnel junction (MTJ) devices associated with the reference cells (e.g., the first reference cell 115 and the second reference cell 116) of the resistive memory reference array 110 and to MTJ devices associated with the resistive memory data array 120. In the alternative, the semiconductor device 100 may optionally include a reference write circuit 141 that is distinct from the write circuit 140 to write parallel and antiparallel states to the reference cells of the resistive memory reference array 110. By including a separate write circuit 141, interference by the trimming circuit 130 is reduced during a normal operating mode (e.g., reading and writing only data cells of the resistive memory data array 120) of the semiconductor device 100.

In operation, the trimming circuit 130 may measure effective reference resistances values corresponding to some or all of the word lines WL[0] . . . WL[N]. For example, the trimming circuit 130 may measure a first effective reference resistance value at the reference resistance measurement circuit 132. The first effective reference resistance value may be based on reference resistance values of multiple reference cells (e.g., the reference cells 115, 116) corresponding to the first word line 111. The reference resistance measurement circuit 132 may also measure a second effective reference resistance value. The second effective reference resistance value may be based on reference resistance values of multiple reference cells corresponding to the second word line 112. The reference resistance measurement circuit 132 may also measure the effective reference resistance value of each of the remaining word lines.

Based on the measured effective reference resistances, the trimming circuit 130 may generate an average effective reference resistance value at the averaging circuit 134. Any number of measured effective reference resistance values may be used to generate the average effective reference resistance. For example, in an array with N+1 word lines, the effective reference resistance of all N+1 word lines may be used to determine the average effective reference resistance value. Based on the average effective reference resistance value, the trimming circuit 130 may trim each reference resistance corresponding to the word lines WL[0] . . . WL[N].

The trimming circuit 130 may compare each word line WL[0] . . . WL[N] individually to the generated average effective reference resistance at the comparing circuit 136. For example, the trimming circuit 130 may compare the effective resistance of each of the first word line 111, the second word line 112, and any number of additional word lines individually to the average effective reference resistance at the comparing circuit 136. In a particular embodiment, the reference resistance measurement circuit 132 may remeasure a particular effective reference resistance corresponding to a particular word line (e.g., the first word line 111 or the second word line 112), and the comparing circuit 136 may compare the remeasured particular effective reference resistance to the average effective reference resistance. Alternatively, the reference resistance measurement circuit 132 may store each effective reference resistance (e.g., the first effective reference resistance and the second effective reference resistance), and the comparing circuit 136 may compare the stored first and second resistances individually to the average effective reference resistance.

After comparing a particular effective reference resistance (e.g., the first effective reference resistance corresponding to the first word line 111) to the average effective reference resistance, the trimming circuit 130 may trim a reference resistance based the average effective reference resistance. In an exemplary embodiment, if the particular effective reference resistance is greater than the average effective reference resistance, the trimming circuit 130 lowers the effective reference resistance, and if the particular effective reference resistance is less than the average effective reference resistance, the trimming circuit 130 raises the effective reference resistance. To raise or lower the reference resistance, the trimming circuit 130 may direct the write circuit 140 to modify a state of an MTJ device associated a reference cell corresponding to the particular word line (e.g., the first reference cell 115 or the second reference cell 116 of the first word line 111) based on a result of the comparison. For example, because the first effective reference resistance is based at least partially on a resistance value of the first reference cell 115 and on a resistance value of the second reference cell 116 (as well as being based on additional reference cells associated with the first word line), the first effective reference resistance level is trimmed by modifying a state of the MTJ device to approximate the average effective reference resistance. Respective effective reference resistances associated with additional word lines of the resistive memory may also be iteratively trimmed by the trimming circuit 130.

In an alternative exemplary embodiment, a reference resistance corresponding to a variable resistor (e.g., the variable resistor 138 or another variable resistor included in the semiconductor device 100) may be trimmed. For example, the trimming circuit 130 may compare a resistance value of the variable resistor 138 to the average effective reference resistance at the comparing circuit 136. When the resistance value is less than the average effective reference resistance, the trimming circuit 130 may increase the resistance value, and when the resistance value is greater than the average effective reference resistance, the trimming circuit 130 may decrease the resistance value. Thus, the resistance value of the variable resistor 136 may be set substantially equal to the average effective reference resistance.

The write circuit 140 may be shared between the resistive memory reference array 110 and the resistive memory data array 120. The write circuit 140 may selectively write to the resistive memory data array 120 or the resistive memory reference array, depending on an operational state of the semiconductor device 100. In a testing/initialization mode, the write circuit 140 may write to the resistive memory reference array as described above. In a normal operating mode, the write circuit 140 may write to the resistive memory data array to store data within the semiconductor device 100. Alternatively, the separate reference write circuit 141 may be used in the testing/initialization mode, and the write circuit 140 may be used in the normal operating mode. For example, the separate reference write circuit 141 may be directed by the trimming circuit 130 to modify a state of an MTJ device associated with the first reference cell 115 or the second reference cell 116.

By including the trimming circuit 130 at the semiconductor device 100, a determination to trim one or more reference cells (e.g., modify a state of a first MTJ device or a second MTJ device of the one or more reference cells) may be performed without using external test circuitry. Thus, the effective reference resistance values associated with the first and second word lines 111, 112 may be measured and trimmed at the semiconductor device, without relying on interaction with an external tester. For example, an external tester is not required to measure effective reference resistances corresponding to the word lines WL[0] . . . WL[N], to generate an average effective reference resistance, to compare a remeasured effective reference resistance of a word line to the average effective reference resistance, or to trim the effective reference resistance corresponding to a word line. Trimming the effective reference resistance values corresponding to word lines (e.g., the first and second word lines 111, 112) as explained above may result in a reduced effective reference resistance value variation as compared to a variation of untrimmed effective reference resistance values because the trimmed effective reference resistance values more closely approximate an average effective reference resistance value. As such, an effective reference resistance value that may be too lower or too high to effectively determine a bit value stored in a data cell (e.g., as due to process variation) may be trimmed to within usable effective reference resistance values. Thus, the reduced effective reference resistance value variation may increase read sensing margin and may increase die yield.

Figure 2:
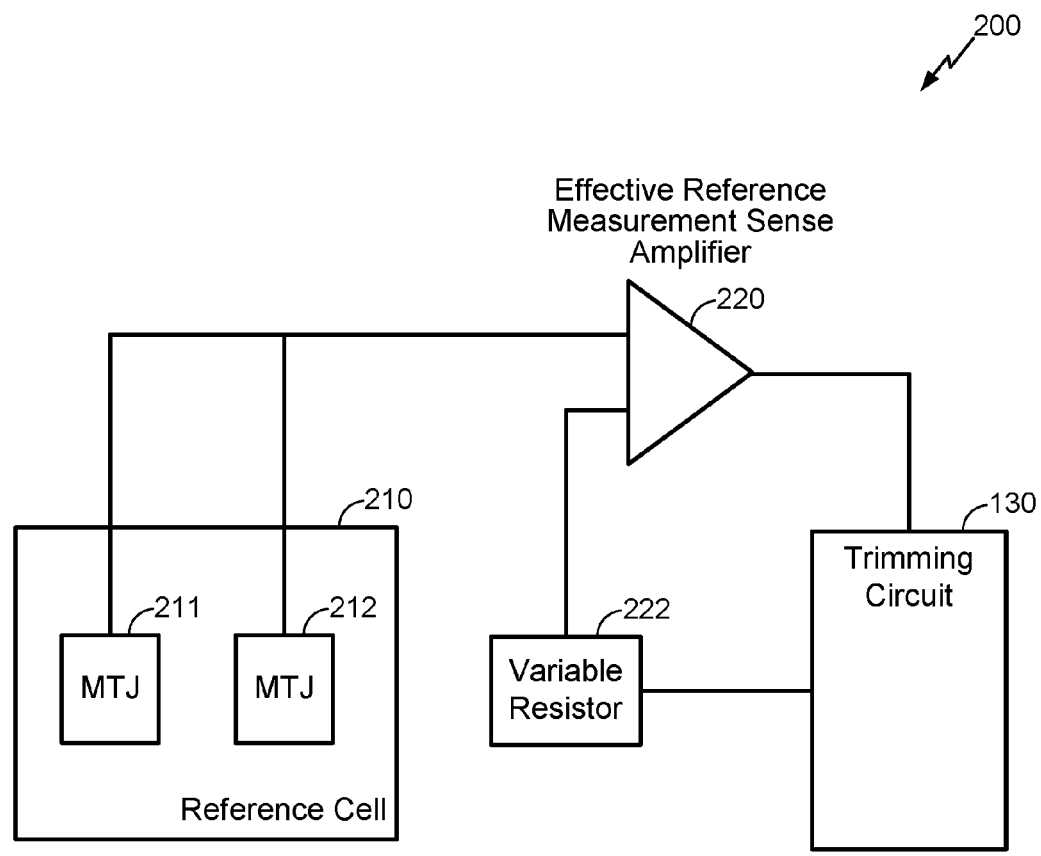
FIG. 2 is a block diagram of a second particular illustrative embodiment of a device with a trimming circuit.

Referring to FIG. 2, a second particular illustrative embodiment of a device with a trimming circuit is disclosed and generally designated 200. The device 200 may include a reference cell 210, such as the first reference cell 115 or the second reference cell 116 of FIG. 1. Alternatively, the reference cell 210 may be another reference cell of the resistive memory reference array 110 of FIG. 1. The device 200 may also include an effective reference resistance measurement sense amplifier 220 coupled to a variable resistor 222 and coupled to the reference cell 210. The effective reference resistance measurement sense amplifier 220 may be part of the trimming circuit 130 (e.g., the variable resistor 222 may correspond to the variable resistor 138 of FIG. 1). In that case, the device 200 may be part of the semiconductor device 100 of FIG. 1. Alternatively, the variable resistor 222 may be separate and in addition to the variable resistor 138 of FIG. 1. The effective reference resistance measurement sense amplifier 220 and the variable resistor 222 may also be distinct from or included as part of the reference resistance measurement circuit 132 and the first and second reference cells 115, 116. The device 200 may also include the trimming circuit 130 of FIG. 1 coupled to an output of the effective reference resistance measurement sense amplifier 220 and coupled to the variable resistor 222. The effective reference resistance measurement sense amplifier 220 and the variable resistor 222 may enable the device 200 to measure an effective resistance of the reference cell 210 or of multiple other reference cells associated with a set of reference cells, such as the first word line 111 or the second word line 112 of the resistive memory reference array 110 of FIG. 1.

The reference cell 210 may include a first MTJ device 211 and a second MTJ device 212. The first and second MTJ devices 211, 212 may be initialized to particular states. For example, the write circuit 140 or the write circuit 141 of FIG. 1 may initialize the first MTJ device 211 to a parallel state and the second MTJ device 212 to an antiparallel state. Alternatively, the first MTJ device 211 may be initialized to an antiparallel state and the second MTJ device 212 may be initialized to a parallel state. Either of the first or second MTJ devices 211, 212 may exhibit a low resistance while in the parallel state or a high resistance while in the antiparallel state. The reference cell 210 may exhibit a high reference resistance when both the first MTJ device 211 and the second MTJ device 212 are in an antiparallel state, a low reference resistance when both the first MTJ device 211 and the second MTJ device 212 are in a parallel state, and a medium reference resistance when the first and second MTJ devices 211, 212 are in opposite states.

Although FIG. 2 shows a single reference cell contributing to an effective reference resistance, for ease of explanation a word line (e.g., the word lines 111, 112 of FIG. 1) typically includes a plurality of reference cells, each reference cell contributing in part to an effective reference resistance associated with the word line. By changing a state of the first MTJ device 211 or the second MTJ device 212, the effective reference resistance of a word line may be increased (e.g., by changing either the first MTJ device 211 or the second MTJ device 212 from a parallel state to an antiparallel state) or decreased (e.g., by changing either the first MTJ device 211 or the second MTJ device 212 from an antiparallel state to a parallel state). The effect that changing a state of a particular MTJ device has on the effective reference resistance of the word line may be small when the word line includes many reference cells. For example, changing a resistance value of a reference cell of a word line that has many reference cells may have a smaller effect on an effective reference resistance corresponding to the word line than changing a resistance value of a reference cell of a word line that has few reference cells. Thus, an effective reference resistance corresponding to a word line that has many reference cells may be finely controlled, each reference cell having a small impact on the effective reference resistance. A reference voltage may be generated at an output of the reference cell 210 based on the reference resistance. For example, a sensing current may be applied to the first and second MTJ devices 211, 212 to generate the reference voltage.

The variable resistor 222 may include a resistance value that may be set to a particular value, incremented by a step value, or decremented by a step value. For example, the variable resistor 222 may include a set of resistive or transistive elements that may be individually activated. The step value may include a resistance value associated with any particular resistive or transistive element. The variable resistor 222 may be responsive to the trimming circuit 130 to set the resistance value. A measurement voltage may be generated at an output of the variable resistor 222. For example, the sensing current may be applied to the variable resistor 222 to generate the measurement voltage.

The reference resistance measurement sense amplifier 220 may include a first input and a second input. The output of multiple reference cells (e.g., the reference cell 210) of a word line (not shown) may be coupled to the first input of the effective reference resistance measurement sense amplifier 220 enabling an effective reference resistance of the first word line to be read at the first input of the reference resistance measurement sense amplifier. The output of the variable resistor 222 may be coupled to the second input of the effective reference resistance measurement sense amplifier 220. The reference resistance measurement sense amplifier 220 may compare the reference voltage corresponding to the effective reference resistance corresponding to the word line to the measurement voltage corresponding to the resistance value of the variable resistor 222. An output of the effective reference resistance sense amplifier 220 may indicate whether the effective resistance corresponding to the reference cell is greater than the resistance value corresponding to the variable resistor 222. For example, the output of the effective reference resistance sense amplifier 220 may be a high voltage or a low voltage depending on whether the effective resistance corresponding to the reference cell 210 is greater than or less than the resistance value corresponding to the variable resistor 222. The output of the effective reference resistance sense amplifier 220 may be coupled to the trimming circuit 130. Although a single reference cell 210 is shown coupled to an input of the reference resistance measurement sense amplifier 220, any number of reference cells, associated with a word line (e.g., two cells as illustrated in FIG. 1) may be coupled to the input of the reference resistance measurement sense amplifier 220.

In operation, the trimming circuit 130 may set a resistance value of the variable resistor 222. The effective reference resistance measurement sense amplifier 220 may compare a resistance value of the variable resistor 222 to an effective reference resistance value based on a reference resistance associated with the reference cell 210, and generate an output that indicates whether the effective reference resistance of a word line (e.g., a word line that includes the reference cell 210) or the variable resistor 222 has a higher resistance. The trimming circuit 130 may use the output of the effective reference resistance measurement sense amplifier 220 to determine whether to increase or decrease the resistance value of the variable resistor 222. The trimming circuit 130 may stop increasing or decreasing the resistance value of the variable resistor 222 when the output of the reference resistance measurement sense amplifier 220 changes. A change in the output of the reference resistance measurement sense amplifier 220 indicates that the resistance value of the variable resistor 222 is within a step resistance value of the reference resistance corresponding to the reference cell 210. When multiple reference cells corresponding to a word line are coupled to the first input of the effective reference resistance sense amplifier 220, a change in the output indicates that the resistance value of the variable resistor 222 is within a step resistance value of an effective reference resistance of the word line. Thus, the trimming circuit 130 measures (within a tolerance of the step size of the variable resistor 222) the effective reference resistance of the word line.

The effective reference resistance measurement circuit 220 and the variable resistor 222 enable the device 200 to measure the effective reference resistance corresponding to a word line (e.g. a word line that includes the reference cell 210) without using external testing equipment. The measured effective reference resistance value may be used by the trimming circuit 130 to determine whether to modify a state of the first MTJ device 211 or the second MTJ device 212 when the effective reference resistance associated with the word line is substantially different than an average of the effective reference resistance values corresponding to multiple word lines. The modified values of the first MTJ device 211 and the second MTJ device 212 may contribute to a modified effective reference resistance. The modified effective reference resistance may be used to determine a bit value of a data cell during a data read operation. Alternatively, the measured effective reference resistance value may be used by the trimming circuit 130 to set a resistance value of the variable resistor 222, or another variable resistor (not shown) associated with the device 200, to the average resistance value. The variable resistor 222 or the other variable resistor may be used to as a reference resistance to determine a bit value of a data bit instead of an effective reference resistance associated with a word line.

Figure 3:
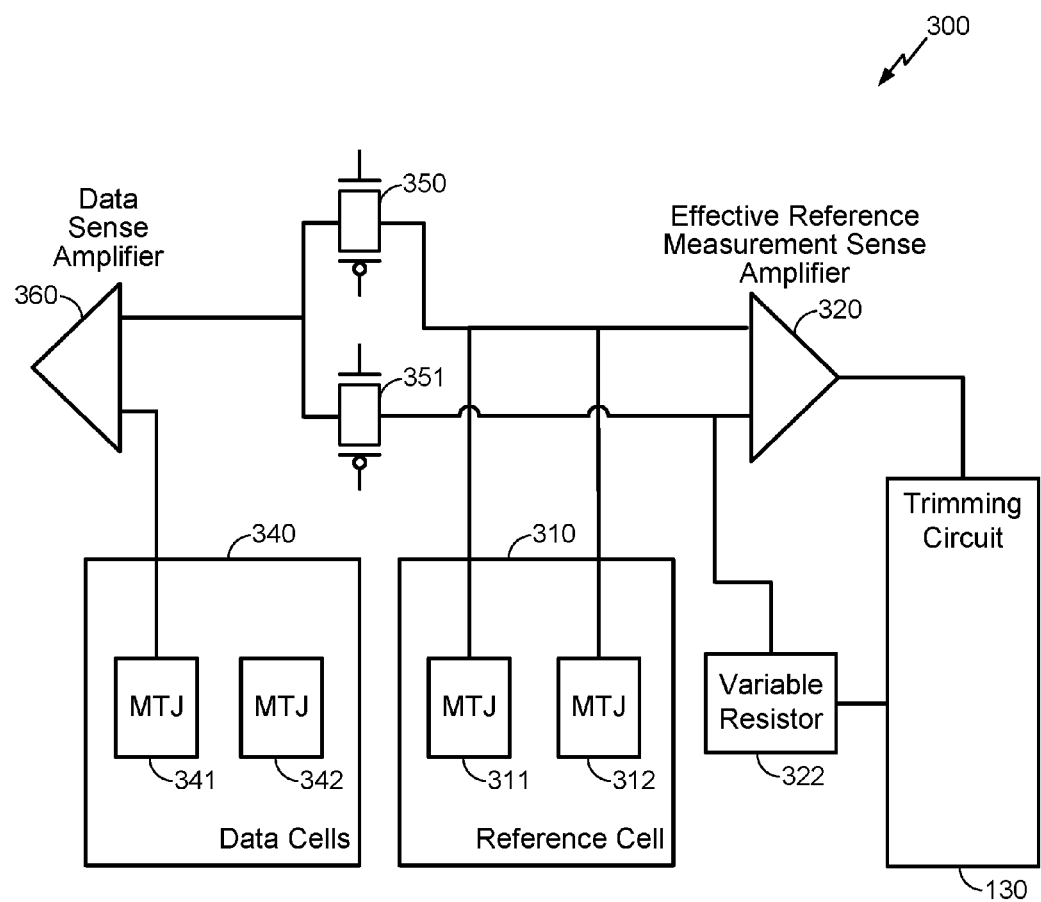
FIG. 3 is a block diagram of a third particular illustrative embodiment of a device with a trimming circuit.

Referring to FIG. 3, a third particular illustrative embodiment of a device with a trimming circuit is disclosed and generally designated 300. The device 300 includes data cells 340 and a data sense amplifier 360. The device 300 may also include reference cells (e.g., reference cell 310) and an effective reference resistance measurement sense amplifier 320. The device 300 may also include the trimming circuit 130 of FIG. 1 and a variable resistor 322. The variable resistor 322 may correspond to the variable resistor 222 of FIG. 2. Alternatively, the variable resistor 322 may be distinct from the variable resistor 222. The device 300 may also include a first transfer gate 350 and a second transfer gate 351. The first and second transfer gates 350, 351 may enable the device 300 to operate in a similar manner to the device 200 of FIG. 2 when the first and second transfer gates 350, 351 are inactive (i.e., restricting current flow). For example, the first and second transfer gates 350, 351 may restrict the data sense amplifier 360 from sensing an effective reference resistance corresponding to a word line that includes reference cells (e.g., the reference cell 310). Thus, the trimming circuit 130 may perform trimming operations without interference from other portions of the device 300. The transfer gates 350, 351 may further enable the data sense amplifier 360 to use the reference cell 310 to determine a value of a data bit when the first transfer gate 350 is active (i.e., allowing current flow) and the second transfer gate 351 is inactive. The transfer gates 350, 351 may further enable the data sense amplifier 360 to use the variable resistor 322 to determine a value of a data bit when the first transfer gate 350 is inactive and the second transfer gate 351 is active.

The data cells 340 may include a first data MTJ device 341 and a second data MTJ device 342. The first data MTJ device 341 may be coupled to a first input of the data sense amplifier 360. The second MTJ device 342 may be coupled to another data sense amplifier (not shown). Alternatively, additional logic may selectively couple the first MTJ device 341 or the second MTJ device 342 to the first input of the data sense amplifier 360. Although, the data cells 340 are shown in FIG. 3 as including two (2) MTJ devices, the data cells 340 may include any number of MTJ devices and are not limited to the first MTJ device 341 and the second MTJ device 342.

The reference cell 310 may include a first MTJ device 311 and a second MTJ device 312. The first and second MTJ devices 311, 312 may correspond to the first and second MTJ devices 211, 212 of FIG. 2. The first and second MTJ devices 311, 312 may be coupled to a first input of the effective reference measurement sense amplifier 320. The first transfer gate 350 may provide a conductive path between the first and second MTJ devices 311, 312 and a second input of the data sense amplifier 360 when the first transfer gate 350 is active, and the first transfer gate 350 may restrict current flow when inactive. The second transfer gate 351 may provide a conductive path between the variable resistor 322 and the second input of the data sense amplifier 360 when the second transfer gate 351 is active, and the second transfer gate 351 may restrict current flow when inactive.

At the time the device 300 is constructed, the device may be tested and initialized. For example, an effective reference resistance trimming operation may take place at the device 300 in order to enable the correct functioning of the device 300 during normal operation. An effective reference resistance trimming operation may also take place at later time during the lifespan of the device 300 in order to refresh the effective reference resistances of the device 300. For example, the device 300 may be included within a computing device that periodically tests and reinitializes the device by performing the effective reference resistance trimming operation.

During an effective reference resistance trimming operation (e.g., testing, initializing) of the device 300, the first and second transfer gates 350, 351 may be inactive. While the first transfer gate 350 is inactive, conductivity between the first and second MTJ devices 311, 312 and the second input of the data sense amplifier 360 is restricted. While second transfer gate 351 is inactive, conductivity between the variable resistor 322 and the second input of the data sense amplifier 360 is also restricted. Thus, while the first and second transfer gates 350, 351 are inactive, the device 300 functions in a similar manner to the device 200 of FIG. 2 because the reference cell 310, the effective reference measurement sense amplifier 320, the variable resistor 322, and the trimming circuit 130 are isolated from the data sense amplifier 360 and the data cells 340. An output of the effective reference resistance measurement sense amplifier 320 may be used by the trimming circuit 130 to set the variable resistor 322 to a resistance value that is substantially equal to an effective reference resistance of a word line associated with the reference cell 310. The measured effective reference resistance may be used by the trimming circuit 130 to determine an average effective reference resistance of a plurality of word lines. For example, the trimming circuit 130 may be configured to store effective reference resistance values associated with multiple word lines. The trimming circuit 130 may also be configured to determine an average of the stored effective reference resistance values. After determining the average effective reference resistance of a plurality of word lines, the trimming circuit 130 may set a resistance value of the variable resistor 322 substantially equal (e.g., within a step resistance of the variable resistor 322) to the average effective reference resistance.

During normal operation (e.g., non-testing, non-initialization) of the device 300, the first transfer gate 350 may be active or the second transfer gate 351 may be active. While the first transfer gate 350 is active, a conductive path between the first and second MTJ devices 311, 312 and the second input of the data sense amplifier 360 is formed. The conductive path permits the data sense amplifier 360 to determine a bit value of the data cell 340 based on the effective reference resistance of the reference cell 310. For example, a sensing current may be applied to the first and second MTJ devices 311, 312 to generate a reference voltage. A sensing current may also be applied to the first data MTJ device 341 to determine a data voltage. The generated reference voltage and the generated data voltage may be compared at the data sense amplifier 360 to generate an output of the data sense amplifier 360 that corresponds to a bit value of the first data MTJ device 341. Similarly, while the second transfer gate 351 is active, a conductive path between the variable resistor 322 and the second input of the data sense amplifier 360 is formed. The conductive path permits the data sense amplifier 360 to determine a bit value based on a resistance value of the variable resistor 322. For example, a sensing current may be applied to the variable resistor 322 to generate the reference voltage. A sensing current may also be applied to the first data MTJ device 341 to determine a data voltage. The generated reference voltage and the generated data voltage may be compared at the data sense amplifier 360 to generate an output of the data sense amplifier 360 that corresponds to the bit value of the first data MTJ device 341. Using the variable resistor 322 to determine the bit value of data cells instead of using the reference cell 310 reduces reference resistance variation at the device 300 as compared to using the reference cell 310. Thus, depending on which transfer gate of the first transfer gate 350 and the second transfer gate 351 is active, the variable resistor 322, the reference cell 310, or any combination thereof, may be used as a reference resistance to determine bit values stored at the data cells 340.

Figure 4:
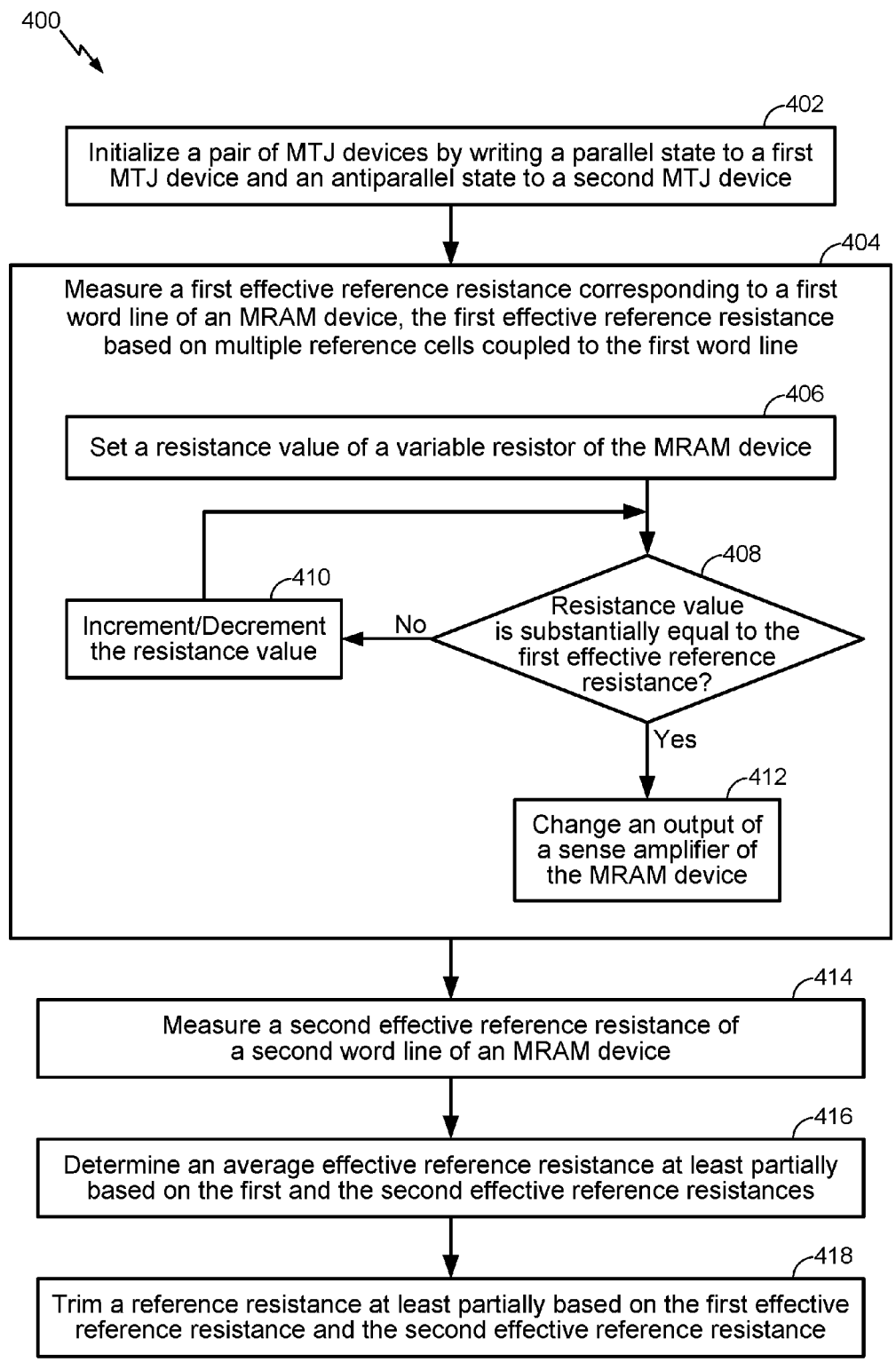
FIG. 4 is a flow chart of a first particular illustrative embodiment of a method of trimming a reference resistance.

Referring to FIG. 4, a particular illustrative embodiment of a method of trimming a reference resistance is disclosed and generally designated 400. The method 400 includes initializing a pair of MTJ devices by putting a first MTJ device in a parallel state and putting a second MTJ device in an antiparallel state, at 402. The method 400 further includes measuring a first effective reference resistance, where the first effective reference resistance is based on a first set of reference cells of a resistive memory device, at 404. Measuring the first effective reference resistance of the first word line may include setting a resistance value of a variable resistor, at 406. The resistance value may be compared to the first effective reference resistance, at 408. When the resistance value is not substantially equal to (e.g., not within a resistance step of) the effective reference resistance, the resistance value may be incremented or decremented by the resistance step, at 410. In one embodiment, the resistance value may be set to a low resistance value and incremented until the resistance value is greater than or equal to the effective reference resistance. Alternatively, the resistance value may be decremented until the resistance value is less than or equal to the effective reference resistance. In a third alternative embodiment, the method 400 may include increasing the resistance value by a variable sized step resistance when the resistance value is less than the effective reference resistance and decreasing the resistance value by the variable step when the resistance value is greater than the effective reference resistance until the resistance value is substantially equal (e.g., within the resistance step) to the effective reference resistance, such as in accordance with a binary search. When the resistance value is substantially equal to the effective reference resistance, an output of a sense amplifier of the resistive memory device may be changed from a low voltage to a high voltage, at 412, to indicate that the measurement has completed, the resistance value of the variable resistor being substantially equal to the effective reference resistance.

The method 400 includes measuring a second effective reference resistance, where the second effective reference resistance is based on a second set of reference cells of the resistive memory device, at 414. The method 400 also includes determining a target reference resistance based on the first effective reference resistance and the second effective reference resistance, at 416. For example, the target reference resistance may be an average effective reference resistance of the first effective reference resistance and the second effective reference resistance. The method 400 includes trimming a reference resistance at least partially based on the target reference resistance, at 418.

Measuring the reference resistance at the resistive memory device circuit enables the trimming to be performed without using external test circuitry. Thus, the effective reference resistances associated with the first and second word lines may be trimmed automatically, without interaction with an external tester. Trimming the effective reference resistances corresponding to the first and second word lines may result in a reduced effective reference resistance value variation as compared to a variation of untrimmed effective reference resistances. The reduced effective reference resistance value variation may in turn lead to an increased read sensing margin and an increased die yield.

The method of FIG. 4 may be initiated by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 4 can be initiated by a processor that executes instructions, as described with respect to FIG. 7.

Figure 5:
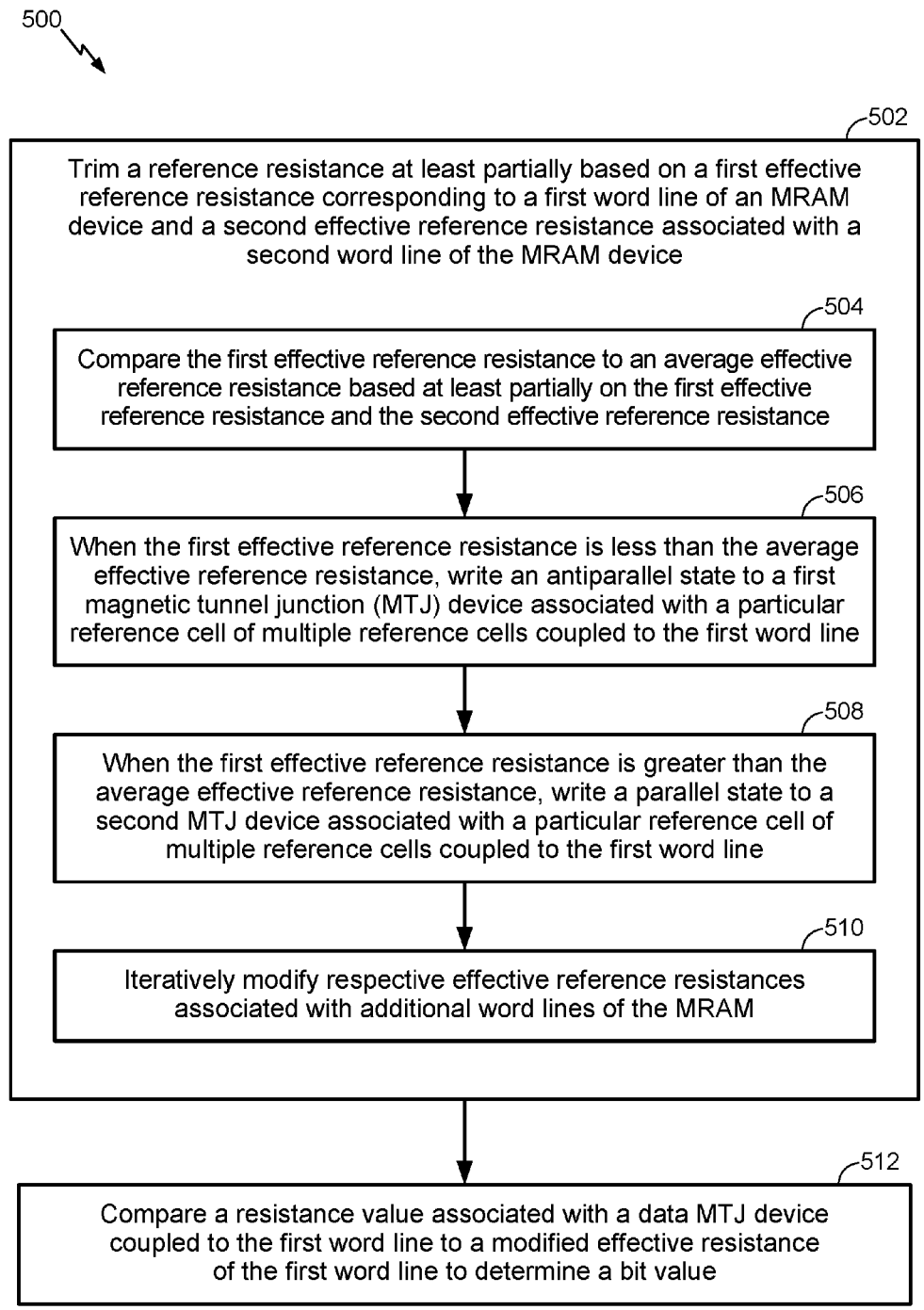
FIG. 5 is a flow chart of a second particular illustrative embodiment of a method of trimming a reference resistance.

Referring to FIG. 5, a second particular illustrative embodiment of a method of trimming a reference resistance is disclosed and generally designated 500. The method 500 may include trimming a reference resistance at least partially based on a target effective reference resistance, at 502. Trimming a reference resistance may include comparing the first effective reference resistance to the target effective reference resistance, at 504. In response to determining that the first effective reference resistance is greater than the target effective reference resistance, a number of MTJ devices associated with the effective reference resistance that are in a parallel state may be increased, a number of MTJ devices associated with the effective reference resistance that are in an antiparallel state may be decreased, or a combination thereof may be performed, at 506. In response to determining that the first effective reference resistance is less than the target effective reference resistance, the number of magnetic tunnel junction devices associated with the effective reference resistance that are in the antiparallel state may be increased, the number of magnetic tunnel junction devices associated with the effective reference resistance that are in the parallel state may be decreased, or a combination thereof may be performed, at 508. Respective effective reference resistances associated with additional sets of reference cells of the resistive memory may also be iteratively modified, at 510. The method 500 may further include comparing a resistance value associated with a data MTJ device associated with the first set of reference cells to a modified effective resistance of the first set of reference cells to determine a bit value, at 512.

Changing the states of the first MTJ device and/or the second MTJ device modifies the first effective reference resistance. The modified first effective reference resistance may be used to determine a bit value of a data cell during a data read operation. Because each word line is iteratively trimmed based on the average effective reference resistance, an effective reference resistance value variation may be reduced.

The method of FIG. 5 may be initiated by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 5 can be initiated by a processor that executes instructions, as described with respect to FIG. 7.

Figure 6:
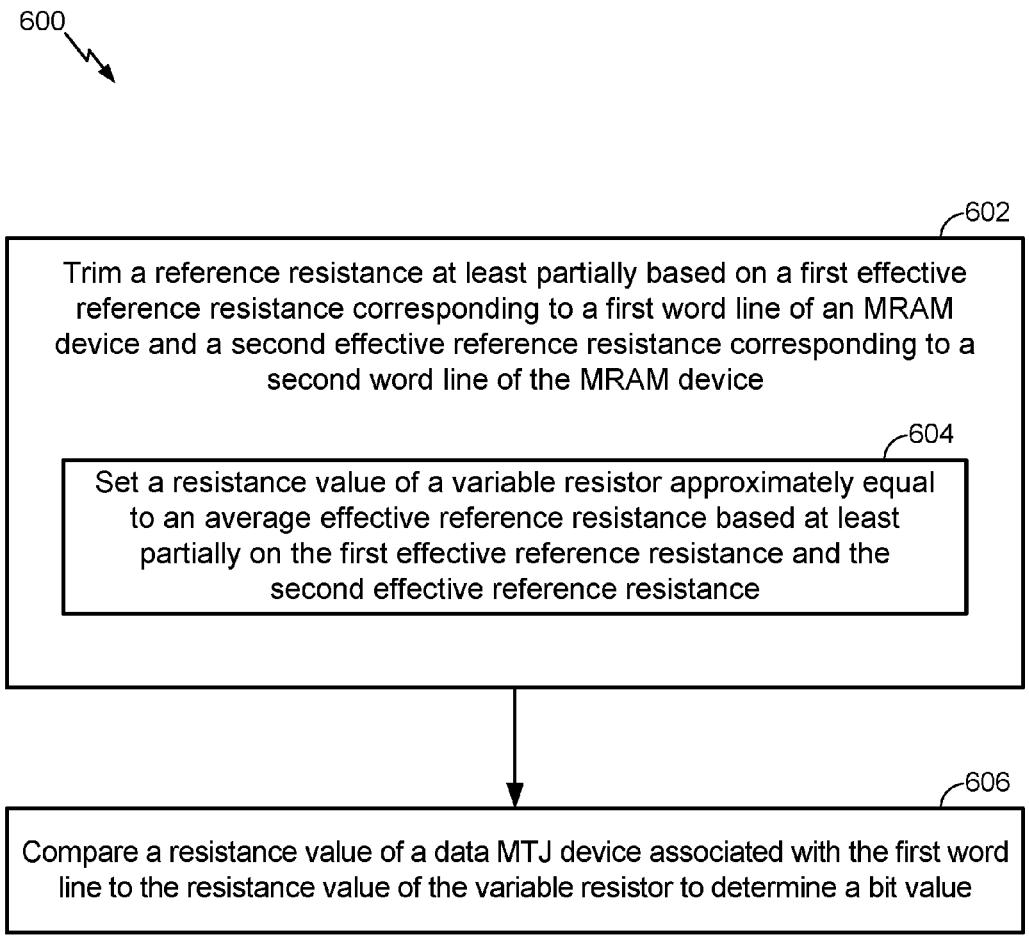
FIG. 6 is a flow chart of a third particular illustrative embodiment of a method of trimming a reference resistance.

Referring to FIG. 6, a third particular illustrative embodiment of a method of trimming a reference resistance is disclosed and generally designated 600. The method 600 includes trimming a reference resistance at least partially based on a target effective reference resistance, at 602. Trimming a reference resistance may include setting a resistance value of a variable resistor approximately equal to the target effective reference resistance, at 604. Setting the resistance value may include, in response to determining that a measured resistance value at the variable resistor is greater than the target effective reference resistance, decreasing the resistance value at the variable resistor, at 606. Setting the resistance value may also include, in response to determining that the measured resistance value at the variable resistor is less than the target effective reference resistance, increasing the resistance value at the variable resistor, at 608. The method 600 may further include comparing a resistance value of a data MTJ device associated with the first set of reference cells to the resistance value of the variable resistor to determine a bit value, at 610. Using the variable resistor to determine the bit value instead of the first effective reference resistance and/or the second effective reference resistance reduces reference resistance variation as compared to the method 500 of FIG. 5.

The method of FIG. 6 may be initiated by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 6 can be initiated by a processor that executes instructions, as described with respect to FIG. 7.

Figure 7:
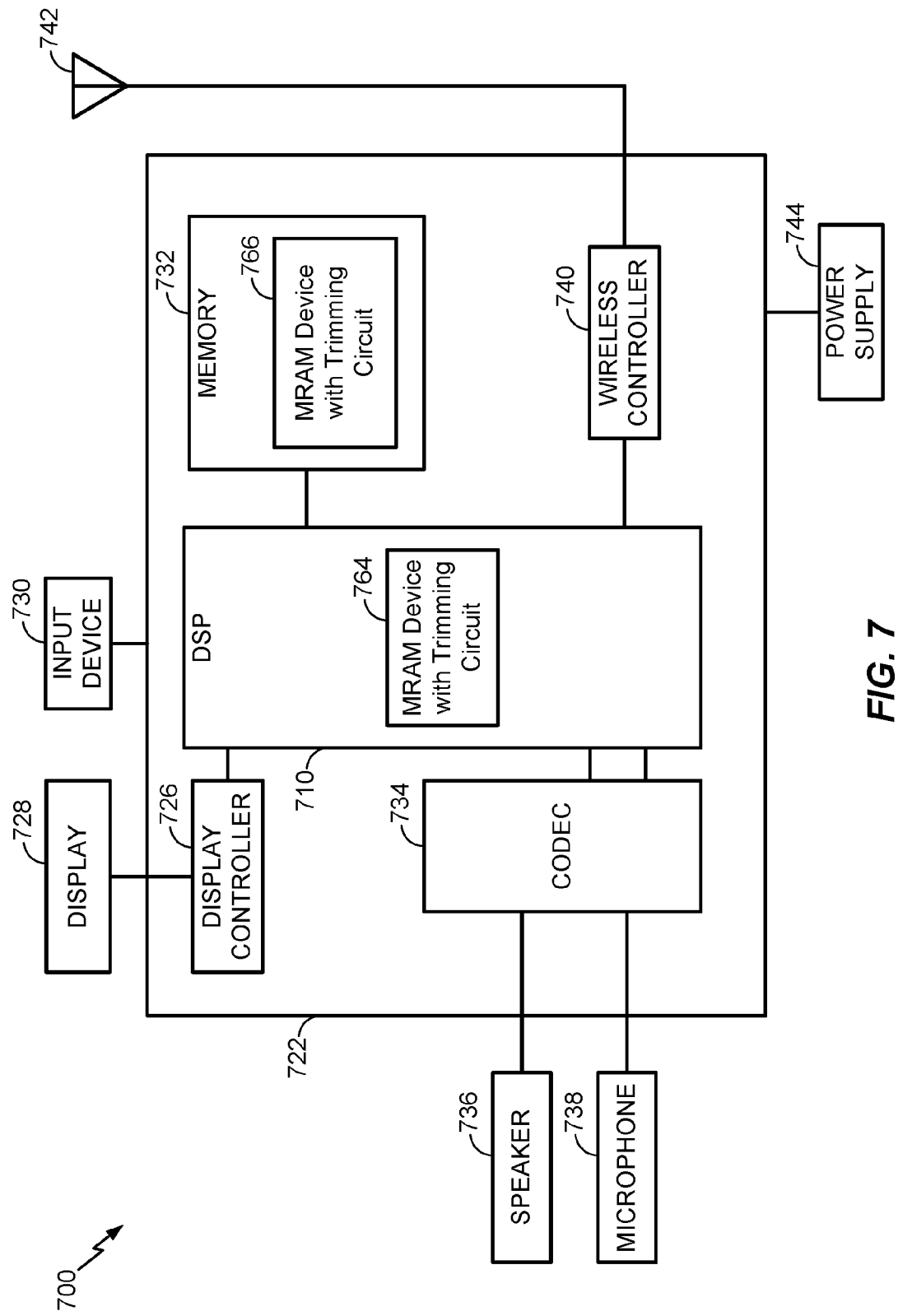
FIG. 7 is a block diagram of device including circuitry for trimming reference resistance levels in a resistive memory.

Referring to FIG. 7, a block diagram of a particular illustrative embodiment of a wireless communication device is depicted and generally designated 700. The device 700 includes a processor, such as a digital signal processor (DSP) 710, coupled to a memory 732. The DSP 710 may include an resistive memory device 764 with a trimming circuit. The memory 732 may also include an resistive memory device 766 with a trimming circuit. In an illustrative embodiment, the resistive memory device 764 and the resistive memory device 766 may correspond to the semiconductor device 100 of FIG. 1, the device 200 of FIG. 2, the device 300 of FIG. 3, or may operate according to the methods of FIG. 4, FIG. 5, FIG. 6, or any combination thereof.

The resistive memory device 764 with a trimming circuit may enable the DSP 710 to perform the operations of initiating trimming of the one or more reference resistances corresponding to the resistive memory device 764. For example, the memory 732 may be a non-transient computer readable medium storing computer-executable instructions that are executable by the processor 710 to cause the processor 710 to perform the operations of initiate trimming of one or more reference resistances corresponding to the semiconductor device 100 of FIG. 1, the device 200 of FIG. 2, the device 300 of FIG. 3, or any combination thereof. For example, the DSP 710 may initiate measuring a first effective reference resistance, initiate measuring a second effective reference resistance, initiate determining a target reference resistance level based on the first effective reference resistance and the second effective reference resistance, and initiate trimming a reference resistance at least partially based on the target reference resistance level, as described with reference to the method 400 of FIG. 4, the method 500 of FIG. 5, the method 600 of FIG. 6, or any combination thereof.

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, the DSP 710, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

In conjunction with the described embodiments, a system is disclosed that may include means for storing multiple resistive reference values. The multiple reference resistance values are arranged in multiple sets of reference cells, such as the resistive memory reference array 110 of FIG. 1, the reference cell 210 of FIG. 2, the reference cell 310 of FIG. 3, one or more other devices or circuits configured to store multiple resistive references arranged in multiple sets of reference cells, or any combination thereof. The system may also include means for accessing a first set of reference cells to measure a first effective reference resistance corresponding to the first set of reference cells and accessing a second set of reference cells to measure a second effective reference resistance corresponding to the second set of reference cells, such as the trimming circuit 130 of FIGS. 1-3, one or more other devices or circuits configured to access a first set of reference cells to measure a first effective reference resistance corresponding to the first set of reference cells and access a second set of reference cells to measure a second effective reference resistance corresponding to the second set of reference cells, or any combination thereof. The system may also include means for setting a reference resistance at least partially based on the first effective reference resistance and the second effective reference resistance, such as the trimming circuit 130 of FIGS. 1-3, the write circuit 140 of FIG. 1, the reference write circuit 141 of FIG. 1, one or more other devices or circuits configured to set a reference resistance at least partially based on the first effective reference resistance and the second effective reference resistance, or any combination thereof.

Figure 8:
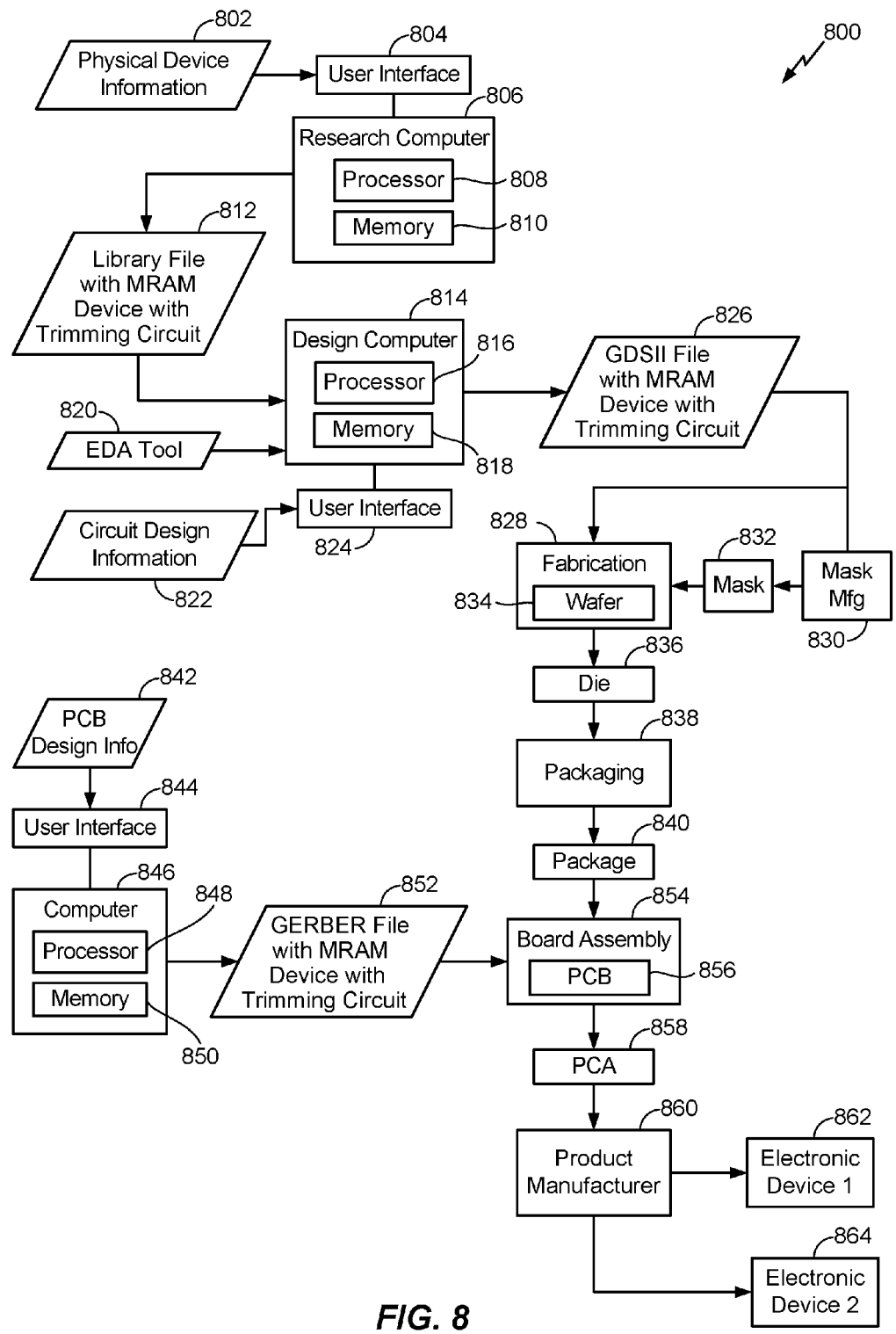
FIG. 8 is a data flow diagram of a particular illustrative embodiment of a manufacturing process to manufacture electronic devices that includes circuitry for trimming reference resistance levels in a resistive memory.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as the semiconductor device 100 of FIG. 1, the device 200 of FIG. 2, the device 300 of FIG. 3, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the semiconductor device 100 of FIG. 1, the device 200 of FIG. 2, the device 300 of FIG. 3, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the semiconductor device 100 of FIG. 1, the device 200 of FIG. 2, the device 300 of FIG. 3, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as semiconductor device 100 of FIG. 1, the device 200 of FIG. 2, the device 300 of FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the semiconductor device 100 of FIG. 1, the device 200 of FIG. 2, the device 300 of FIG. 3, or any combination thereof, in addition to other circuits or information. To illustrate, the data file may include information corresponding to a system-on-chip (SOC) that includes the semiconductor device 100 of FIG. 1, the device 200 of FIG. 2, the device 300 of FIG. 3, and that also includes additional electronic circuits and components within the SOC.

The GDSII file 826 may be received at a fabrication process 828 to manufacture the semiconductor device 100 of FIG. 1, the device 200 of FIG. 2, the device 300 of FIG. 3, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including a device that includes the semiconductor device 100 of FIG. 1, the device 200 of FIG. 2, the device 300 of FIG. 3, or any combination thereof.

At the fabrication process, a memory 837 may include instructions, that when executed by a processor 835, cause the processor to initiate trimming of one or more reference resistances corresponding to the semiconductor device 100 of FIG. 1, the device 200 of FIG. 2, the device 300 of FIG. 3, or any combination thereof. For example, the processor 835 may initiate measuring a first effective reference resistance, initiate measuring a second effective reference resistance, initiate determining a target reference resistance level based on the first effective reference resistance and the second effective reference resistance, and initiating trimming a reference resistance at least partially based on the target reference resistance level, as described with reference to the method 400 of FIG. 4, the method 500 of FIG. 5, the method 600 of FIG. 6, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the semiconductor device 100 of FIG. 1, the device 200 of FIG. 2, the device 300 of FIG. 3, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the semiconductor device 100 of FIG. 1, the device 200 of FIG. 2, the device 300 of FIG. 3, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the semiconductor device 100 of FIG. 1, the device 200 of FIG. 2, the device 300 of FIG. 3 is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 100 of FIG. 1, the device 200 of FIG. 2, the device 300 of FIG. 3, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
at a resistive memory device:
determining an average effective reference resistance level based on a first effective reference resistance and a second effective reference resistance, the first effective references resistance based on a first set of reference cells of the resistive memory device and the second effective reference resistance based on a second set of reference cells of the resistive memory device; and
trimming a reference resistance at least partially based on the average effective reference resistance level, wherein trimming the reference resistance comprises, in response to determining that the first effective reference resistance is not substantially equal to the average effective reference resistance level, modifying one or more states of one or more magnetic tunnel junction devices associated with the first effective reference resistance.

2. The method of claim 1, wherein the one or more states are modified to decrease the first effective reference resistance in response to determining that the first effective reference resistance is greater than the average effective reference resistance level.

3. The method of claim 2, wherein modifying the one or more states comprises increasing a number of magnetic tunnel junction devices of the one or more magnetic tunnel junction devices that are in a parallel state, decreasing a number of magnetic tunnel junction devices of the one or more magnetic tunnel junction devices that are in an antiparallel state, or a combination thereof.

4. The method of claim 1, wherein the one or more states are modified to increase the first effective reference resistance in response to determining that the first effective reference resistance is less than the average effective reference resistance level.

5. The method of claim 4, wherein modifying the one or more states comprises increasing a number of magnetic tunnel junction devices of the one or more magnetic tunnel junction devices that are in an antiparallel state, decreasing a number of magnetic tunnel junction devices of the one or more magnetic tunnel junction devices that are in a parallel state, or a combination thereof.

6. The method of claim 1, further comprising, prior to determining the average effective reference resistance level, initializing a particular reference cell of the first set of reference cells such that a first magnetic tunnel junction device is in a parallel state and a second magnetic tunnel junction device is in an antiparallel state.

7. The method of claim 6, further comprising:
measuring the first effective reference resistance after initializing the particular reference cell; and
measuring the second effective reference resistance.

8. The method of claim 1, wherein the first set of reference cells corresponds to a first word line of the resistive memory device, and wherein the second set of reference cells corresponds to a second word line of the resistive memory device.

9. The method of claim 1, wherein the resistive memory device comprises a magnetoresistive random access memory (MRAM) device, a resistive random access memory (ReRAM) device, a phase change random access memory (PCRAM) device, or any combination thereof.

10. The method of claim 1, wherein trimming the reference resistance is further based on effective reference resistances corresponding to remaining sets of reference cells of the resistive memory device.

11. The method of claim 1, wherein trimming the reference resistance further comprises modifying respective effective reference resistances associated with additional sets of reference cells of the resistive memory device.

12. The method of claim 1, further comprising:
comparing a resistance value associated with a data magnetic tunnel junction device associated with the first set of reference cells to the first effective reference resistance to determine a bit value.

13. The method of claim 1, further comprising measuring the first effective reference resistance, wherein measuring the first effective reference resistance comprises:
setting a resistance value of a variable resistor;
comparing the resistance value to the first effective reference resistance;
in response to determining that the resistance value is greater than or equal to the first effective reference resistance, changing an output, at a sense amplifier of the resistive memory device, from a low voltage to a high voltage; and
in response to determining that the resistance value is less than the first effective reference resistance, sending a control signal to the variable resistor to increment the resistance value.

14. An apparatus comprising:
a resistive memory reference array comprising multiple sets of reference cells;
a reference resistance measurement circuit configured to measure a first effective reference resistance corresponding to a first set of reference cells and to measure a second effective reference resistance corresponding to a second set of reference cells;
a trimming circuit configured to set a reference resistance based on the first effective reference resistance and the second effective reference resistance; and
a write circuit coupled to the trimming circuit, the write circuit configured to modify one or more states of one or more magnetic tunnel junction devices corresponding to the first effective reference resistance in response to a determination that the first effective reference resistance is not substantially equal to an average effective reference resistance corresponding to the multiple sets of reference cells.

15. The apparatus of claim 14, wherein the trimming circuit is further configured to compare the first effective reference resistance to the average effective reference resistance.

16. The apparatus of claim 14, wherein the write circuit is further configured to increase a number of magnetic tunnel junction devices of the one or more magnetic tunnel junction devices that are in a parallel state, decrease a number of magnetic tunnel junction devices of the one or more magnetic tunnel junction devices that are in an antiparallel state, or a combination thereof, in response to a determination that the first effective reference resistance is less than the average effective reference resistance.

17. The apparatus of claim 14, wherein the write circuit is further configured to increase a number of magnetic tunnel junction devices of the one or more magnetic tunnel junction devices that are in an antiparallel state, decrease the number of magnetic tunnel junction devices of the one or more magnetic tunnel junction devices that are in a parallel state, or a combination thereof, in response to a determination that the first effective reference resistance is greater than the average effective reference resistance.

18. The apparatus of claim 14, wherein the write circuit is further configured to selectively modify the first effective reference resistance by changing resistive states corresponding to the first set of reference cells to initialize a first magnetic tunnel junction device in a parallel state and a second magnetic tunnel junction device in an antiparallel state.

19. The apparatus of claim 14, further comprising:
an averaging circuit coupled to the reference resistance measuring circuit, wherein the averaging circuit is configured to receive the first effective reference resistance and the second effective reference resistance from the reference resistance measuring circuit and to compute an average effective reference resistance.

20. The apparatus of claim 14, further comprising a resistive memory data array, wherein the write circuit is configured to selectively write to the resistive memory reference array or to the resistive memory data array.

21. The apparatus of claim 14, further comprising:
a data sense amplifier;
a data cell coupled to a first input of the data sense amplifier; and
a first transfer gate coupled to a second input of the data sense amplifier and to one or more reference cells of the first set of reference cells, wherein the first transfer gate enables the data sense amplifier to determine a bit value of the data cell based on the first effective reference resistance.

22. The apparatus of claim 21, further comprising:
a variable resistor; and
a second transfer gate coupled to the variable resistor and coupled to the second input of the data sense amplifier, wherein the second transfer gate enables the data sense amplifier to determine the bit value of the data cell based on a resistance value corresponding to the variable resistor.

23. The apparatus of claim 14 integrated in at least one semiconductor die.

24. The apparatus of claim 14, further comprising a device selected from the group consisting of a set top box, a music player, a video player, an entertainment unit, a navigation device, a communications device, a personal digital assistant (PDA), a fixed location data unit, and a computer, into which the resistive memory reference array, the reference resistance measurement circuit, the write circuit, and the trimming circuit are integrated.

25. An apparatus comprising:
means for storing multiple reference resistance values, the multiple reference resistance values arranged in multiple sets of reference cells;
means for accessing a first set of reference cells to measure a first effective reference resistance corresponding to the first set of reference cells and for accessing a second set of reference cells to measure a second effective reference resistance corresponding to the second set of reference cells;
means for setting a reference resistance based on the first effective reference resistance and the second effective reference resistance; and
means for modifying one or more states of one or more magnetic tunnel junction devices corresponding to the first effective reference resistance in response to a determination by the means for setting that the first effective reference resistance is not substantially equal to an average effective reference resistance corresponding to the multiple sets of reference cells.

26. The apparatus of claim 25 integrated in at least one semiconductor die.

27. The apparatus of claim 25, further comprising a device selected from the group consisting of a set top box, a music player, a video player, an entertainment unit, a navigation device, a communications device, a personal digital assistant (PDA), a fixed location data unit, and a computer, into which the means for storing, the means for accessing, the means for setting, and the means for modifying are integrated.

28. A computer readable storage device storing instructions that, when executed by a processor, cause the processor to perform operations comprising:
at resistive memory device:
initiating determining of an average effective reference resistance level based on a first effective reference resistance and a second effective reference resistance, the first effective reference resistance based on a first set of reference cells of the resistive memory device and the second effective reference resistance based on a second set of reference cells of the resistive memory device; and
initiating trimming of a reference resistance at least partially based on the average effective reference resistance level, wherein trimming the reference resistance comprises, in response to determining that the first effective reference resistance is not substantially equal to the average effective reference resistance level, modifying one or more states of one or more magnetic tunnel junction devices associated with the first effective reference resistance.

29. The computer readable storage device of claim 28, wherein the one or more states are modified to decrease the first effective reference resistance in response to determining that the first effective reference resistance is greater than the average effective reference resistance level, and wherein the one or more states are modified to increase the first effective reference resistance in response to determining that the first effective reference resistance is less than the average effective reference resistance level.

30. The computer readable storage device of claim 28, wherein the instructions are executable by a processor integrated in a device selected from the group consisting of a set top box, a music player, a video player, an entertainment unit, a navigation device, a communications device, a personal digital assistant (PDA), a fixed location data unit, and a computer.

* * * * *